United States Patent [19]

Theuwissen

[11] Patent Number: 5,914,205
[45] Date of Patent: Jun. 22, 1999

[54] METHOD OF MANUFACTURING A SEMICONDUCTOR DEVICE WHEREBY PHOTOMASKS COMPRISING PARTIAL PATTERNS ARE PROJECTED ONTO A PHOTORESIST LAYER SO AS TO MERGE INTO ONE ANOTHER

[75] Inventor: Albert J.P. Theuwissen, Eindhoven, Netherlands

[73] Assignee: U.S. Philips Corporation, New York, N.Y.

[21] Appl. No.: 09/007,552

[22] Filed: Jan. 15, 1998

Related U.S. Application Data

[62] Division of application No. 08/774,854, Dec. 27, 1996, Pat. No. 5,792,591.

[51] Int. Cl.⁶ ........................................................ G03F 9/00
[52] U.S. Cl. .................................................... 430/5; 430/22
[58] Field of Search ................................... 430/5, 22, 322; 355/53, 77

[56] References Cited

U.S. PATENT DOCUMENTS

| | | |
|---|---|---|
| 4,591,540 | 5/1986 | Bohlen et al. . |
| 5,273,850 | 12/1993 | Lee et al. . |
| 5,308,741 | 5/1994 | Kemp . |
| 5,364,718 | 11/1994 | Oae et al. . |
| 5,424,154 | 6/1995 | Borodovsky ............................. 430/5 |
| 5,437,946 | 8/1995 | McCoy ..................................... 430/5 |

FOREIGN PATENT DOCUMENTS

0434142A1  6/1991  European Pat. Off. .

*Primary Examiner*—S. Rosasco
*Attorney, Agent, or Firm*—Brian J. Wieghaus

[57] ABSTRACT

A method of manufacturing a semiconductor device whereby a photoresist layer is provided on a surface of a slice of semiconductor material, after which two photomasks corresponding to adjoining portions of a pattern to be formed in the photoresist are projected on the photoresist by means of a projection lens, with overlapping edges. Strip-shaped transparent end portions of the two photomasks which are situated within this edge and which overlap one another in projection are provided with strip-shaped connection patterns which overlap one another in projection and which exhibit a complementary transmittance in projection. To keep the quantity of computer data necessary for describing the photomasks comparatively small, the strip-shaped transparent end portions of the two photomasks overlapping one another in projection are provided at their edges only with strip-shaped connection patterns overlapping one another in projection.

11 Claims, 5 Drawing Sheets

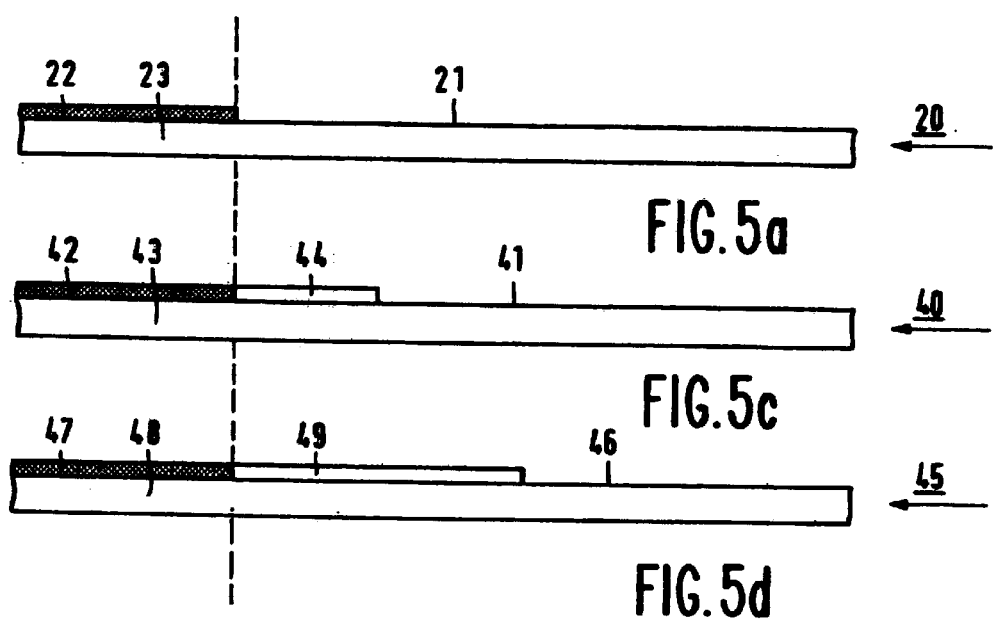
FIG.5a
FIG.5c
FIG.5d
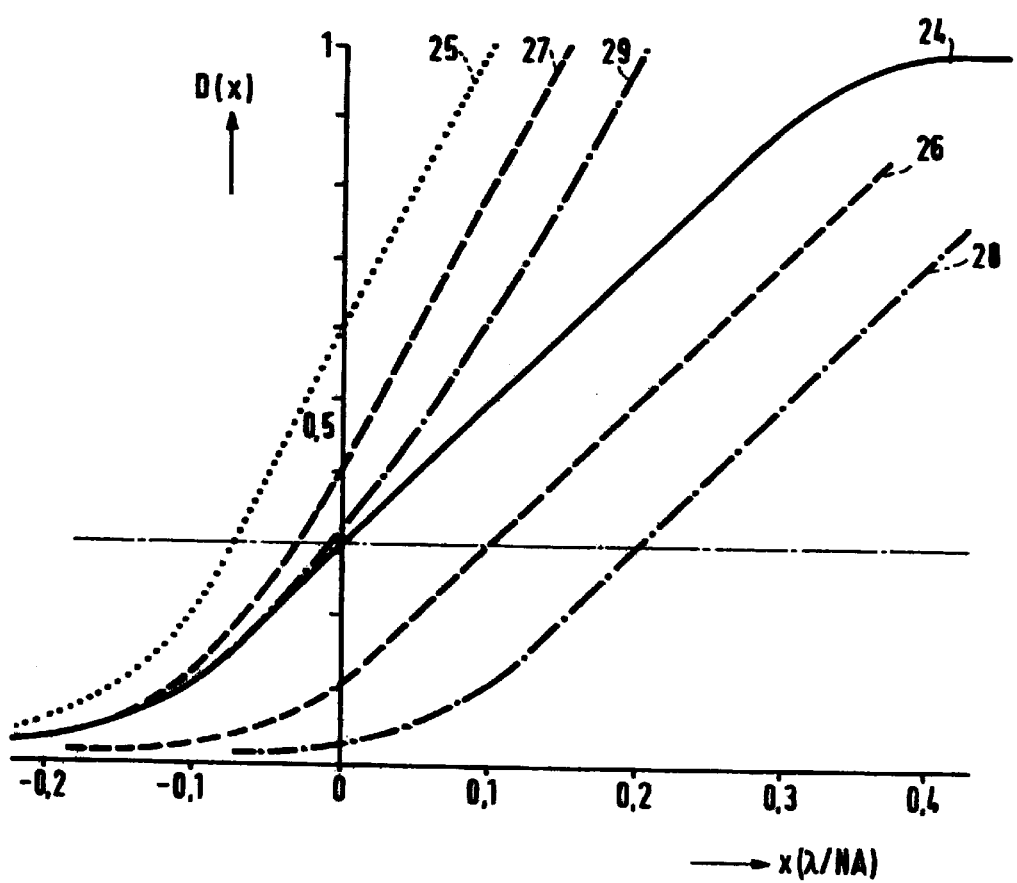
FIG.5b

METHOD OF MANUFACTURING A SEMICONDUCTOR DEVICE WHEREBY PHOTOMASKS COMPRISING PARTIAL PATTERNS ARE PROJECTED ONTO A PHOTORESIST LAYER SO AS TO MERGE INTO ONE ANOTHER

This is a divisional of application Ser. No. 08/774,854, filed Dec. 27, 1996 now U.S. Pat. No. 5,792,591.

BACKGROUND OF THE INVENTION

The invention relates to a method of manufacturing a semiconductor device whereby a photoresist layer is provided on a surface of a slice of semiconductor material, after which photomasks corresponding to mutually connecting portions of a pattern to be formed in the photoresist are projected onto the photoresist by means of a projection lens, with pattern edges superimposed on one another, while strip-shaped transparent end portions of the photomasks situated within this edge and mutually overlapping in projection are provided with strip-shaped connection patterns which overlap one another in projection and which exhibit a complementary transmittance in projection.

In such a method, a pattern which is too large for being projected by means of a single photomask onto a layer of photoresist is subdivided into mutually adjoining partial patterns which are accommodated in different photomasks. These photomasks are projected onto the photoresist with overlapping edges each time, so that the portions of the pattern to be formed merge into one another again in projection. Integrated circuits may thus be manufactured which cover a comparatively large surface area of the semiconductor slice. The total pattern in the photoresist layer is then formed by the transparent end portions which overlap in projection and lie inside the edges and by the transparent end portions of the masks which do not overlap in projection and are not situated within the edges.

EP-A-434142 discloses a method of the kind mentioned in the opening paragraph whereby strip-shaped transparent end portions of the photomasks overlapping one another in projection are provided over their entire surface areas with connection patterns having a transmittance which shows a gradient seen in the longitudinal direction of the strip-shaped transparent end portions. This is achieved in that these strip-shaped transparent end portions are provided with non-transparent regions whose number and/or size changes in the longitudinal direction of the strip-shaped end portions and which are not imaged individually in projection.

Were the photomasks not provided with such connection patterns, then the photoresist layer would receive a total radiation dose at the area of the transparent portions overlapping one another in projection which is twice the radiation dose at the area of transparent portions of the photomasks not overlapping one another in projection. The transparent portions which overlap in projection would then receive a double radiation dose. With photomasks projected on a positive photoresist, a pattern will be formed therein after development which shows a greater width where it was irradiated with the double dose compared with where it was irradiated with the single dose. In the case of projection on a negative photoresist, a pattern with a smaller width is formed by double irradiation. Wherever the masks overlap, a widening or narrowing of lines will occur, so that the photomask patterns do not merge seamlessly into one another. Since the connection patterns of the photomasks show a complementary transmittance in projection, it is achieved that the photoresist layer does receive an equally large total radiation dose at the areas of strip-shaped transparent portions overlapping one another in projection during the projection of the photomasks, compared with areas where transparent portions of the photomasks do not overlap in projection. The photoresist is accordingly irradiated with exactly the same radiation dose over the entire surface area of the slice. The patterns of the photomasks will thus merge into one another seamlessly, i.e. without widening or narrowing of lines.

A photomask suitable for being projected onto a layer of photoresist by means of a projector in practice comprises a glass plate covered with a metal layer, such as chromium, into which a pattern of transparent portions has been etched. An electron beam writes the pattern into a photoresist layer provided on the metal layer. After development, a mask will have been formed which is used for etching the metal layer into the desired pattern. The electron beam is controlled by a computer during writing from a computer data file in which the pattern was laid down. A pattern thus provided on a glass plate is projected onto the photoresist layer in practice by means of a projection lens on a reduced scale, for example, reduced by a factor three or five.

The computer data files in which the photomasks have been laid down and which are used in the known method as described comprise a huge quantity of data necessary for defining the connection patterns. It may be necessary in practice for very many, for example 5000 lines of the masks to merge into one another in projection. This may lead to an undesirably large quantity of computer data when the known connection patterns are used.

SUMMARY OF THE INVENTION

The invention has for its object inter alia to improve the method mentioned in the opening paragraph in such a manner that the patterns of the photomasks still merge seamlessly into one another in the photoresist layer, while nevertheless the quantity of computer data necessary for laying down the patterns of the photomasks is considerably reduced.

According to the invention, the method is for this purpose characterized in that the strip-shaped transparent end portions of the photomasks overlapping one another in projection are provided at their edges only with the strip-shaped connection patterns overlapping one another in projection. The connection patterns thus occupy a surface area on the photomask which is only a portion of that which is occupied by the connection patterns in the known method described above. In the known method, said surface area was equal to the surface area occupied by the transparent end portions of the photomasks overlapping one another in projection, in the method according to the invention only a portion thereof. The quantity of computer data necessary for laying down the connection patterns in the transparent end portions of the photomasks overlapping one another in projection is thus considerably reduced.

The invention is based on the recognition that said widening or narrowing of lines results only from the dose with which the photoresist is irradiated at the areas of the edges of the transparent strip-shaped portions which overlap one another in projection. The measure according to the invention ensures that the photoresist receives in total an equally large radiation dose at the areas of these edges as at the areas of transparent portions of the photomasks which do not overlap in projection. No widening of lines accordingly occurs at the areas of the edges. Between said edges, the photoresist does receive a radiation dose which is twice as large, but a widening of lines which would be the result thereof is as it were compensated for within the edges.

Preferably, the strip-shaped transparent end portions of the photomasks which overlap one another in projection are provided at their edges with strip-shaped connection patterns having a width which, upon projection on the photoresist, is greater than 0.2 $\lambda$/NA, where $\lambda$ is equal to the wavelength of the radiation used in the projection, and NA is equal to the numerical aperture of the projection lens used in the projection.

It is found that the widening of lines discussed above substantially does not occur when connection patterns having such a width are used. With a width of the strip-shaped connection patterns equal to 0.2 $\lambda$/NA, the widening of lines is only one tenth the widening of lines which would occur if the transparent end portions of the two photomasks were not provided with connection patterns. The widening of lines is even less when the width is greater than 0.2 $\lambda$/NA.

The connection patterns are imaged continuously during the projection of the photomasks on the photoresist layer when the strip-shaped connection patterns overlapping one another in projection comprise transparent regions which are formed as rectangular regions with a length and a width which are smaller than 0.4 $\lambda$/NA in projection, where $\lambda$ is the wavelength of the radiation used in the projection and NA is the numerical aperture of the projection lens used in the projection.

To limit the quantity of computer data necessary for laying down the masks, the strip-shaped connection patterns overlapping one another in projection are formed as a single row of rectangular transparent regions.

The quantity of computer data necessary for laying down the photomasks is further limited when the connection patterns overlapping one another in projection exhibit a complementary transmittance which remains constant over their entire surface in projection. The transmittance of mutually overlapping connection patterns may be, for example, 30% and 70%, respectively. Different sets of computer data are then necessary for the masks for describing the connection patterns. This is not the case when the connection patterns overlapping one another in projection exhibit a complementary transmittance of 50% over their entire surface. The overlapping connection patterns are identical then, whereby the required quantity of computer data is limited still further.

BRIEF DESCRIPTION OF THE DRAWINGS

The invention will be explained in more detail below by way of example with reference to a drawing, in which:

FIG. 5*b* is a standardized graph showing the radiation dose D(x) received by the photoresist on the surface of the slice as a function of the location x on this surface, FIG. 6 diagrammatically and in plan view shows a relevant stage in the manufacture of a semiconductor device, where photomasks comprising partial patterns provided with connection patterns of complementary transmittance are projected on a photoresist layer so as to merge into one another, and FIGS. 7 to 9 diagrammatically show photomasks with partial patterns provided with preferred embodiments of connection patterns of complementary transmittance.

DETAILED DESCRIPTION OF THE PREFERRED EMBODIMENTS

Figure 1:
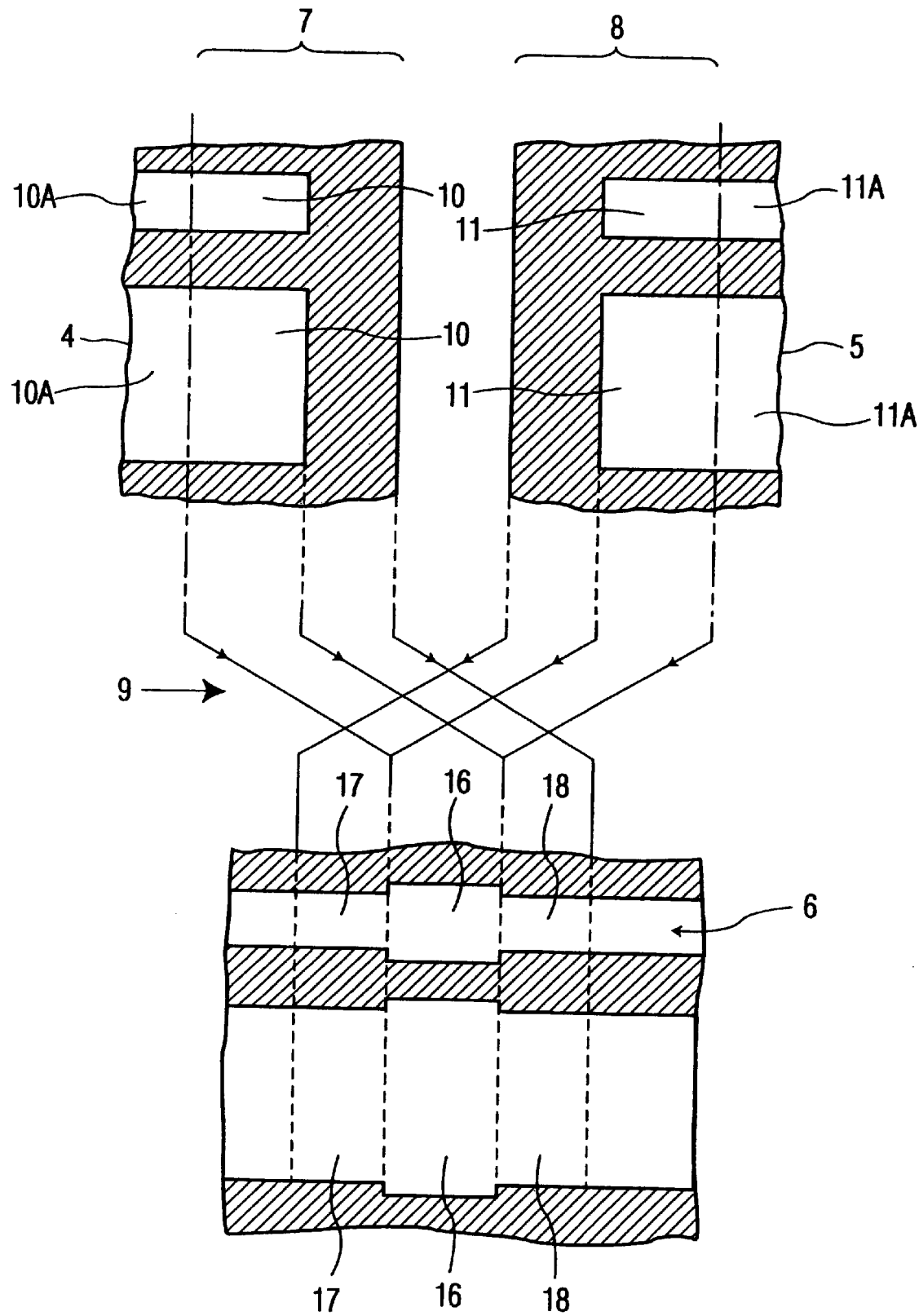
FIGS. 1 to 4 diagrammatically show a few stages in the manufacture of a semiconductor device, where photomasks comprising partial patterns are projected continuously on a photoresist layer, FIG. 1 in plan view and FIGS. 2 to 4 in cross-section, FIGS. 5*a, c* and *d* shows a detail of a number of photomasks.
Figure 2:
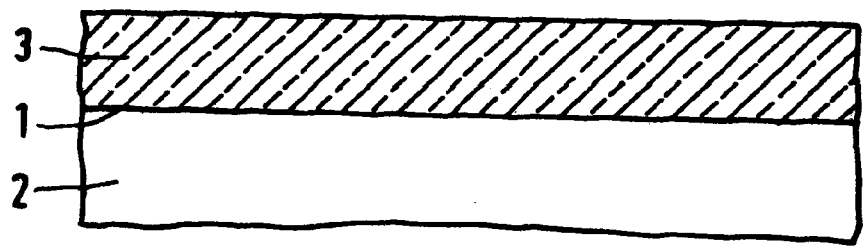
Figure 3:
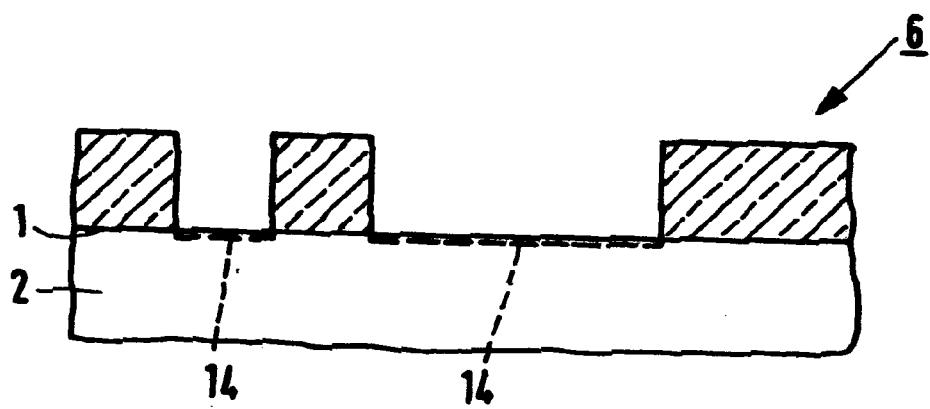
Figure 4:
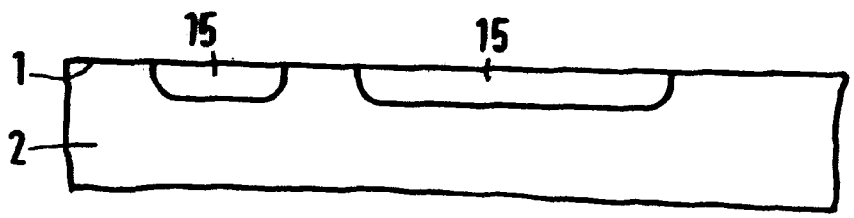
Figure 6:
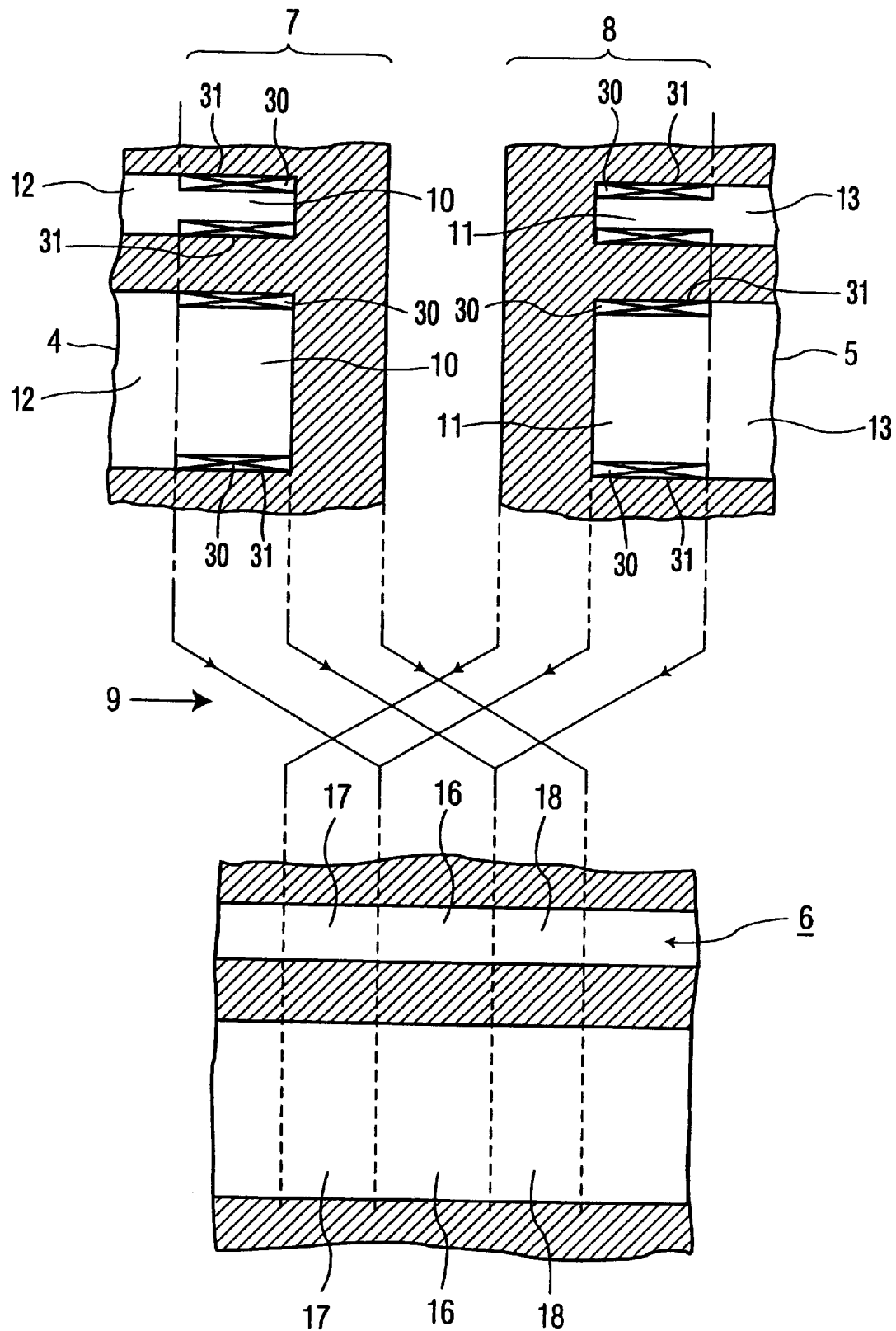

FIGS. 1 to 4 diagrammatically show, FIG. 1 in plan view and FIGS. 2 to 4 in cross-section, a few stages in the manufacture of a semiconductor device where a photoresist layer 3 is provided on a surface 1 of a slice of semiconductor material 2, after which photomasks 4 and 5 corresponding to mutually adjoining portions of a pattern 6 to be formed in the photoresist 3, with an edge 7 of the photomask 4 and an edge 8 of the photomask 5 overlapping one another as indicated diagrammatically with arrows 9, are so projected on the photoresist 3 that strip-shaped transparent end portions 10 of the photomask 4 situated within the edge 7 and strip-shaped transparent end portions 11 of the photomask 5 situated within the edge 8 overlap one another in projection. The pattern 6 is formed in the photoresist 3 through development of the photoresist 3. This photoresist mask may be used, for example, as an implantation mask. Ions of a dopant are then implanted in the slice 2 during an ion implantation step to be carried out, as is indicated diagrammatically in FIG. 3 with broken lines 14. Doped semiconductor zones 15 are then formed during a subsequent heat treatment.

In FIG. 1, the masks 4 and 5 and the pattern 6 formed in the photoresist layer 3 are drawn at the same size for reasons of clarity, but in practice the masks 4 and 5 are projected on the photoresist layer, for example, reduced by a factor three or five.

In this method, the pattern 6 to be formed is subdivided into mutually adjoining partial patterns which are provided in the photomasks 4 and 5. These photomasks 4 and 5 are projected on the photoresist 3 with their edges 7 and 8 overlapping one another, so that the partial patterns merge into one another again in projection. Integrated circuits may thus be manufactured which cover a surface area of the slice of semiconductor material on which the desired pattern cannot be imaged by means of a single photomask. The pattern 6 in the photoresist layer 3 comprises strip-shaped portions 16 which are formed by the transparent strip-shaped end portions 10 and 11 which overlap one another in projection and are situated within the edges 7 and 8, portions 17 formed by transparent portions 10A of photomask 4 not overlapping with portions 11 or 11A of photomask 5 in projection and not situated within the edge 7, and portions 18 formed by transparent portions 11A of photomask 5 which do not overlap with portions 10 or 10A of photomask 4 in projection and are not situated within the edge 8.

The photoresist layer 3 receives a total radiation dose at the area of the transparent portions 10 and 11 overlapping one another in projection which is twice as great as that received at the area of transparent portions of the photomasks 12 and 13 which do not overlap one another in projection. The transparent portions 10 and 11 overlapping one another in projection receive a double radiation dose. When the photomasks are projected onto a positive photoresist 3, as in the present example, a pattern 6 will be formed therein after development whose strip-shaped portions 16 irradiated with the double dose will have a greater width than the strip-shaped portions 17 and 18 irradiated with the single dose.

FIG. 5*a* shows a detail of a photomask 20 with a strip-shaped transparent portion 21 etched into a chromium layer 22 which was provided on a glass substrate 23. When this portion of the mask is projected on the photoresist layer 3 during a certain irradiation time t, the photoresist will receive a radiation dose D(x) which shows a gradient as indicated with line 24 in FIG. 5b in the direction transverse to the projection of the strip-shaped portion 21 as a function of the location x on the surface of the slice. FIG. 5b shows this gradient in a standardized form. The dose D(x) is 0 in those locations where the photoresist receives no radiation, and 1 in those locations where the photoresist receives a maximum radiation dose. The location x on the surface of the slice is given in units $\lambda/NA$, $\lambda$ being the wavelength of the radiation used in the projection and NA is the numerical aperture of the projection lens used for the projection. The gradient of the radiation dose D(x) shown in this standardized form is valid for each projection system used in practice. For a usual projection system—such as, for example, a projector of the PAS 2500 (ASM) type—which pictures the photomasks on the photoresist five times reduced with radiation having a wavelength $\lambda$ of 436 nm and by means of a projection lens with a numerical aperture NA of 0.43, the units $\lambda/NA$ is approximately 1000 nm. The radiation dose D(0) is approximately 0.3 on the edge of the mask, where x=0. The irradiation time t is now so chosen in practice that the photoresist becomes capable of development in those locations where the radiation dose D(x) is greater than 0.3, and is just incapable of development in those locations where the radiation dose D(x) is smaller than 0.3.

When the photoresist is irradiated twice with the same mask 20, the photoresist is irradiated with a radiation dose $D_1(x)$ which shows a gradient as indicated with line 25 in FIG. 5b. This radiation dose $D_1(x)$ indicated with line 25 is twice the radiation dose D(x) indicated with line 24 ($D_1(x)=2.D(x)$). It can be derived from FIG. 5b that the radiation dose indicated with line 25 has the value 0.3 for x=−0.075 $\lambda/NA$. Upon development, therefore, a wider pattern is formed in the photoresist in the case of double irradiation than in the case of single irradiation. For the practical projection system mentioned above, this line widening through double irradiation amounts to approximately 75 nm.

The line widening described with reference to FIG. 5 was based on a positive photoresist, of which irradiated portions are soluble in developer. When a negative photoresist is used, the non-irradiated portions are soluble in developer. Irradiation with a double dose then leads to narrowing of lines, not to widening of lines.

A widening or narrowing of lines takes place where the masks overlap in the method where by photomasks comprising partial patterns are projected on a photoresist layer so as to adjoin one another. The photomask patterns do not merge seamlessly into one another then. When the transparent end portions 10 and 11 of the photomasks 4 and 5 are provided with the connection patterns 30 which have a complementary transmittance in projection, it is achieved that the photoresist layer 3 does receive the same radiation dose in total at the area of the strip-shaped transparent portions 10 and 11 overlapping one another in projection during the projection of the photomasks 4 and 5 as at the areas of transparent portions 12 and 13 of the photomasks which do not overlap in projection. The photoresist is thus irradiated with exactly the same radiation dose over the entire surface of the slice. The patterns of the photomasks 4 and 5 will accordingly merge into one another seamlessly, so without widening or narrowing of lines.

FIG. 5c shows in detail a portion of a photomask 40 etched into a chromium layer 42 which was provided on a glass substrate 43. The mask is provided with a connection pattern 44 which has a width b of 0.1 $\lambda/NA$ in projection on the photoresist and which, for example, has a transmittance of 50% over its entire surface area. When this portion of the mask 40 is projected twice on the photoresist layer 3, the photoresist is irradiated with a radiation dose $D_2(x)$ which shows a gradient as indicated with line 27 in FIG. 5b as a function of the location x in the direction transverse to the projection of the strip-shaped portion 41. This radiation dose $D_2(x)$ is the sum of the radiation dose indicated with line 24 and the radiation dose indicated with line 26 and shifted over a distance 0.1 $\lambda/NA$: $D_2(x)=D(x)+D(x-b)$. It can be derived from FIG. 5b that the radiation dose $D_2(x)$ indicated with line 27 has the value 0.3 for x=−0.030 $\lambda/NA$. This widening of the line upon double radiation is approximately 30 nm for the practical projection system mentioned above.

FIG. 5d further shows in detail a portion of a photomask 45 etched in a chromium layer 47 which was provided on a glass substrate 48. The mask is provided with a connection pattern 49 which has a width 2b of 0.2 $\lambda/NA$ in projection on the photoresist and which has a transmittance of, for example, 50% over its entire surface area. When this portion of the mask 45 is projected twice on the photoresist layer 3, the photoresist is irradiated with a radiation dose $D_3(x)$ which has a gradient as indicated with line 29 in FIG. 5b as a function of the location x in the direction transverse to the projection of the strip-shaped portion 46. This radiation dose $D_3(x)$ is the sum of the radiation dose indicated with line 24 and the radiation dose indicated with line 28 and shifted over a distance 0.2 $\lambda/NA$: $D_3(x)=D(x)+D(x-2b)$. It can be derived from FIG. 5b that the radiation dose $D_3(x)$ indicated with line 29 has the value 0.3 for x<−0.010 $\lambda/NA$. This line widening upon double irradiation amounts to less than 10 nm for the practical projection system mentioned above.

The use of the connection patterns 44 and 49 is found to achieve that the widening of lines referred to above can be strongly suppressed. Connection patterns were described in the examples which had a transmittance of 50% over the entire surface area. It will be clear that the same results are obtained with connection patterns having different transmittance gradients over their surface, as long as it is ensured that the two connection patterns which overlap one another in projection have a complementary transmittance, so that the photoresist receives a total radiation dose of 0.3 seen over the entire surface area of the connection patterns.

In the manufacture of the photomasks, the pattern is written into a photoresist layer provided on the metal layer by means of an electron beam. A mask is then formed after development which is used for etching the metal layer into the desired pattern. The electron beam is controlled during writing by a computer from a computer data file in which the pattern has been laid down.

To limit the quantity of computer data necessary for laying down the photomask patterns considerably, according to the invention, the strip-shaped transparent end portions 10 and 11 of the photomasks 4 and 5 overlapping one another in projection are provided at their edges 31 only with the strip-shaped connection patterns 30 overlapping one another in projection. The connection patterns 30 thus occupy only a comparatively small portion of the surface area of the photomask 4, 5, while their width is greater than 0.2 $\lambda/NA$ in projection on the photoresist, as described above, $\lambda$ being the wavelength of the radiation used for the projection and NA being the numerical aperture of the projection lens used for the projection.

It is found that the widening of lines discussed above substantially does not occur when connection patterns of such a width are used. When the width of the strip-shaped connection patterns is 0.2 $\lambda$/Na, the widening of the lines is no more than one tenth the widening of the lines which would occur if the transparent end portions of the two photomasks were not provided with connection patterns. The widening of the lines is even less when the width is greater than 0.2 $\lambda$/NA.

Figure 7:
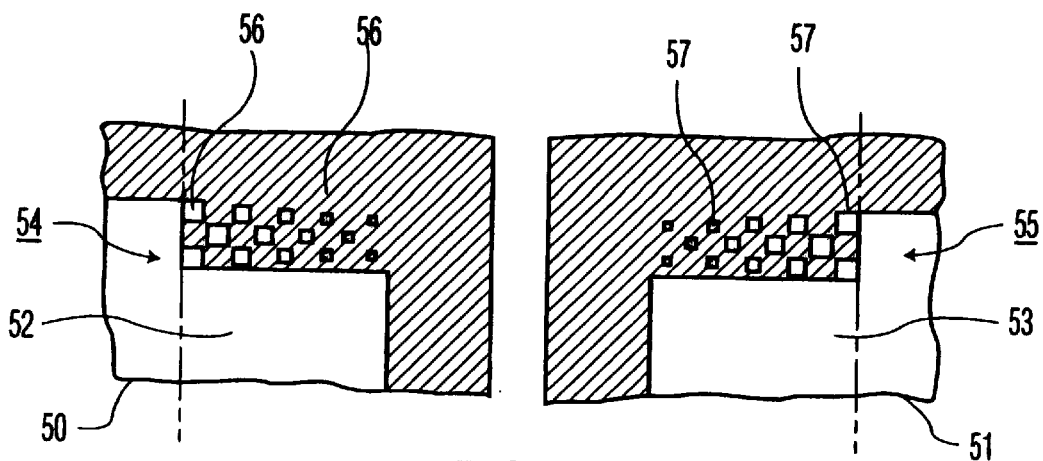

FIG. 7 shows photomasks 50 and 51 with strip-shaped end portions 52 and 53 overlapping one another in projection, with connection patterns 54 and 55 having transparent regions 56 and 57 in the form of rectangular regions. These regions have a length and a width smaller than 0.4 $\lambda$/NA in projection, $\lambda$ being the wavelength of the radiation used for the projection and NA being the numerical aperture of the projection lens used for the projection. These connection patterns 54 and 55 are imaged continuously upon projection of the photomasks on the photoresist layer. Furthermore, the size of the regions 56, 57 is so distributed over the surface of the connection patterns 54 and 55 that the transmittance of these connection patterns in projection shows a continuous gradient, as in a usual grey stage. Such rectangular regions can be described by means of comparatively few computer data, so that the quantity of data necessary for describing the photomasks 50 and 51 is limited. The transparent end portions 52, 53 on the masks 50 and 51 have a length, for example, of 10 $\mu$m and a width of 20 $\mu$m, while the connection patterns 54 and 55 have a length also of 10 $\mu$m and a width of 5 $\mu$m. The transparent rectangular regions 56 and 57 have dimensions which show a gradient of approximately 20 steps from 350 nm×400 nm×down to 150 nm×150 nm.

To reduce the quantity of computer data necessary for laying down the masks, the strip-shaped connection patterns overlapping one another in projection are arranged as a single row of rectangular transparent regions.

Figure 8:
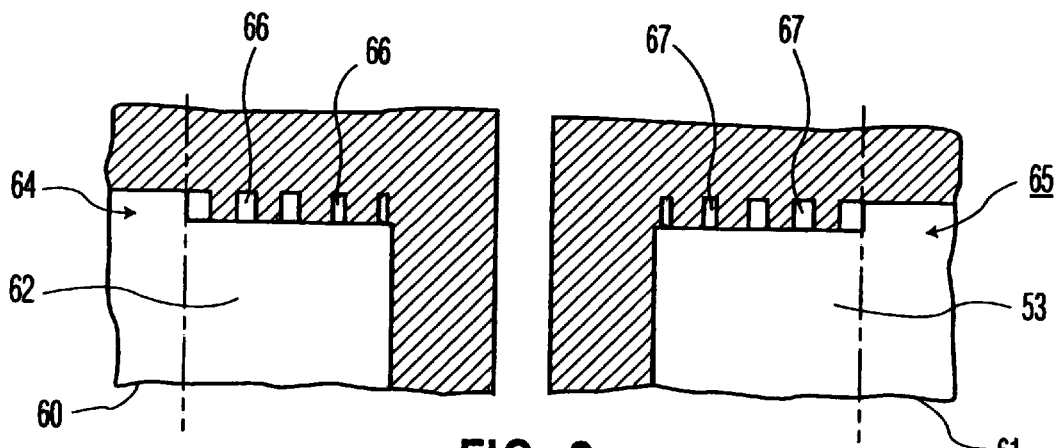

FIG. 8 shows photomasks 60 and 61 with strip-shaped end portions 62 and 63 overlapping one another in projection, with a length of 10 $\mu$m and a width of 20 $\mu$m, and with connection patterns 64 and 65 provided with transparent regions 66 and 67 in the form of rectangular regions having a length of 400 nm and a width decreasing gradually in steps from 400 nm down to 159 nm. Since the number of rectangular transparent regions 66 and 67 is limited to a single row of such regions, even less computer data are necessary for laying down these masks 60 and 61 than for the masks 50 and 51 shown in FIG. 7.

Figure 9:
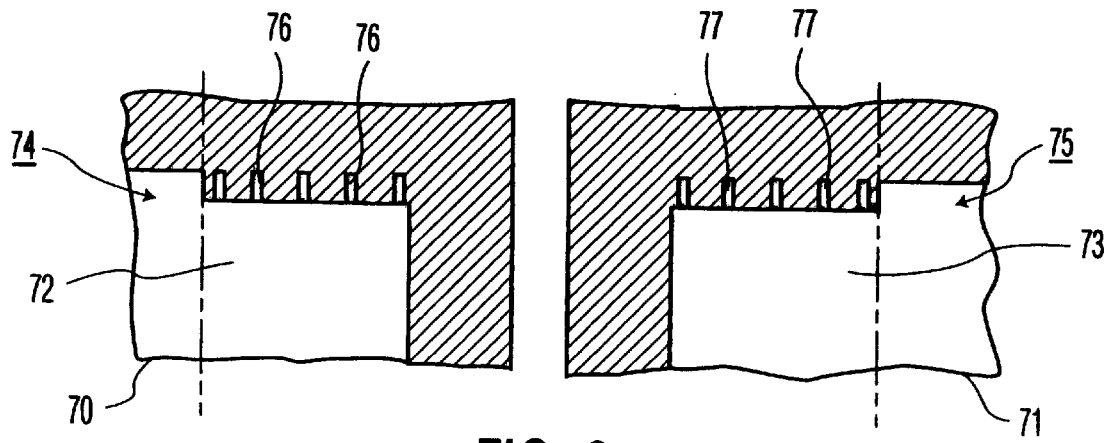

FIG. 9 shows photomasks 70 and 71 with strip-shaped end portions 72 and 73 overlapping one another in projection, with a length of 10 $\mu$m and a width of 20 $\mu$m, and with connection patterns 74 and 75 provided with transparent regions 76 and 77 in the form of rectangular regions of 400 nm length and with a fixed width. The connection patterns 74 and 75 show a complementary transmittance over their entire surface area.

The transmittance of mutually overlapping connection patterns 74 and 75 may be, for example, 30% and 70%, respectively. Different sets of computer data are necessary then for the masks for describing the connection patterns. This is not the case if, as shown in FIG. 9, the connection patterns 74 and 75 which overlap one another in projection show a complementary transmittance of 50% which remains the same over their entire surface area in projection. The overlapping connection patterns 74 and 75 are then identical for the photomasks 70 and 71, whereby the quantity of computer data required is still further limited. The approximately 20 transparent rectangular regions 76 and 77 then have a width of approximately 250 nm, and a mutual interspacing also of approximately 250 nm.

What is claimed is:

1. A photomask set for use in manufacturing a semiconductor device using a photolithographic technology by which photoresist is provided on a semiconductor material and is irradiated to form a pattern therein, the set comprising:

a first photomask including a first portion of the pattern, the first portion having an end portion, the end portion comprising a connection pattern, the connection pattern being disposed at a side of the end portion so as to extend therefrom a distance substantially of 0.2 $\lambda$/NA; and a second photomask including a second portion of the pattern, the second portion having an end portion, the end portion comprising a connection pattern, the connection pattern being disposed at a side of the end portion so as to extend therefrom a distance substantially of 0.2 $\lambda$/NA so that, when the photoresist is irradiated through the first photomask using a standardized radiation dose D of approximately 1 so as to form in the photoresist the first portion of the pattern and the photoresist is irradiated through the second photomask using a standardized radiation dose D of approximately 1 so as to form in the photoresist the second portion of the pattern, the respective connection patterns substantially overlap and provide in the photoresist associated therewith a complementary radiation dose substantially equal to 1.

2. The photomask set of claim 1, wherein the connection patterns have substantially equal lengths.

3. The photomask set of claim 1, wherein at least one of the connection patterns extends a substantially uniform distance from the side of the associated end portion along the length of that connection pattern.

4. The photomask set of claim 1, wherein at least one of the connection patterns has the length substantially equal to the length of the associated end portion.

5. The photomask set of claim 1, wherein the connection patterns have substantially complementary shapes and dimensions.

6. The photomask set of claim 1, wherein at least one of the connection patterns includes one or more transparent, rectangular regions having length and width dimensions which are each smaller than 0.2 $\lambda$/NA.

7. The photomask set of claim 6, wherein at least one of the connection patterns includes a plurality of transparent, rectangular regions arranged in a single row.

8. The photomask set of claim 7, wherein at least one of the connection patterns includes a plurality of transparent, rectangular regions having substantially uniform dimensions.

9. The photomask set of claim 7, wherein the connection patterns include a plurality of transparent, rectangular regions which are located and have dimensions so that each connection pattern has a substantially uniform transmittance of 50% along the length thereof.

10. The photomask set of claim 9, wherein the connection patterns include a plurality of transparent, rectangular regions which have distributed dimensions and locations so that, in irradiation, the transmittance of each connection pattern comprises a continuous gradient, and the gradient associated with one such connection pattern is complementary to the gradient associated with the other such connection pattern.

11. The photomask set of claim 6, wherein the connection patterns include a plurality of transparent, rectangular regions, the connection pattern of one such end portion having regions of gradually increasing dimensions and the connection pattern of the other such end portion having gradually decreasing dimensions, associated regions of the connection patterns being arranged on the respective photomasks so that, in irradiation, complementary transmittance is achieved.

\* \* \* \* \*